United States Patent [19]

Tarui et al.

[11] 3,946,424
[45] Mar. 23, 1976

[54] HIGH FREQUENCY FIELD-EFFECT TRANSISTORS AND METHOD OF MAKING SAME

[75] Inventors: Yasuo Tarui, Kurume; Yutaka Hayashi, Hoya, both of Japan

[73] Assignee: Kogyo Gijutsuin, Japan

[22] Filed: Aug. 13, 1974

[21] Appl. No.: 497,061

Related U.S. Application Data

[63] Continuation of Ser. No. 305,760, Nov. 13, 1972, abandoned, which is a continuation-in-part of Ser. No. 55,368, July 16, 1970, abandoned.

[30] Foreign Application Priority Data
Oct. 31, 1969 Japan.............................. 44-86871
Oct. 31, 1969 Japan.............................. 44-86872
Oct. 31, 1969 Japan.............................. 44-86873

[52] U.S. Cl................... 357/42; 307/221 C; 357/23; 357/58
[51] Int. Cl.²........................................ H01L 27/02
[58] Field of Search............. 307/221 C; 357/23, 42, 357/58

[56] References Cited
UNITED STATES PATENTS

| | | | |
|---|---|---|---|
| 3,427,514 | 2/1969 | Olmstead et al...................... | 357/23 |
| 3,512,099 | 5/1970 | Ohwada................................ | 357/42 |
| 3,631,310 | 12/1971 | Das....................................... | 357/23 |
| 3,653,978 | 4/1972 | Robinson et al...................... | 357/42 |
| 3,685,140 | 8/1972 | Engeler................................. | 357/23 |

OTHER PUBLICATIONS

R. Lohman, "Applications of Musfet's in Microelectronics", S.C.P. and Solid State Technology, Mar. 1966, pp. 23–29.

*Primary Examiner*—Andrew J. James
*Assistant Examiner*—Joseph E. Clawson, Jr.
*Attorney, Agent, or Firm*—Robert E. Burns; Emmanuel J. Lobato; Bruce L. Adams

[57] ABSTRACT

A high frequency insulated gate field effect transistor comprises a semiconductor body of one type of conductivity, a base region of the same type of conductivity as the semiconductor body but with a higher impurity concentration than the body, and drain and source regions of the opposite type of conductivity. A portion of the base region is disposed between the drain region and the source region and the impurity concentration of the base region is reduced from the source region toward the drain region and is less at its junction with the drain region than that of the drain region. Such transistor can be incorporated in an integrated circuit as an amplifier transistor with a depletion type transistor as a load transistor. A common region serves both as a drain region of the amplifier transistor and a source region of the load transistor. A process of making the transistor and the integrated circuit comprises masking a semiconductor body, forming windows in the mask and successively diffusing through the same window both a first impurity to form the base region and a second impurity to form the source region.

12 Claims, 13 Drawing Figures

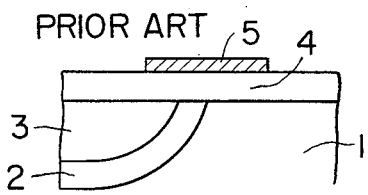
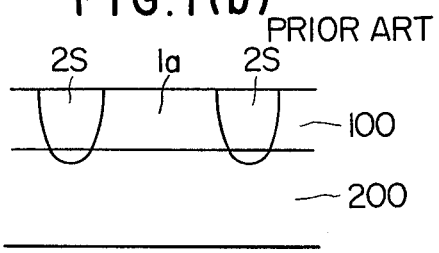
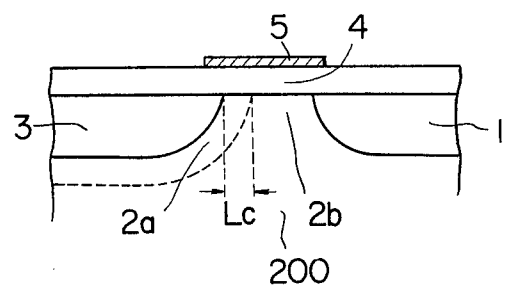
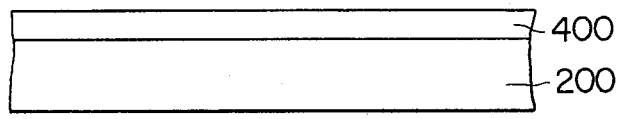
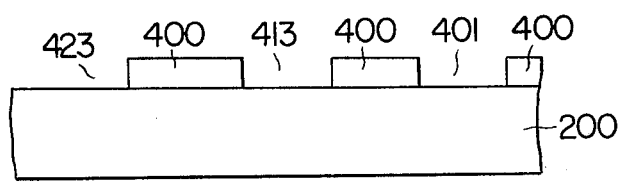
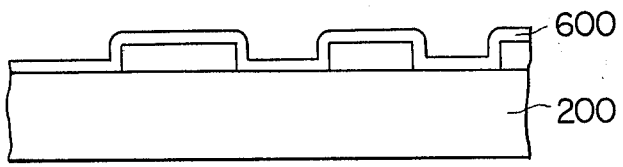
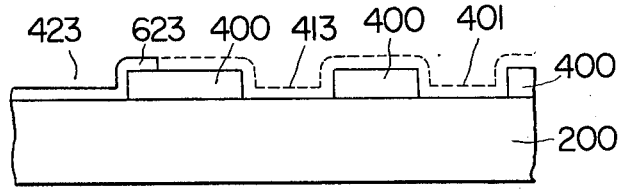

HIGH FREQUENCY FIELD-EFFECT TRANSISTORS AND METHOD OF MAKING SAME

This is a continuation of application Ser. No. 305,760 now abandoned filed Nov. 13, 1972 which is a CIP of application Ser. No. 55,368 now abandoned filed July 16, 1970.

BACKGROUND OF THE INVENTION:

This invention relates to a high frequency field-effect transistor necessitating no epitaxial and isolation regions and being adapted for various integrated circuits. Recently, an improved field effect transistor having a channel length which is determined by the difference between diffusion distances of impurities into the substrate from the same selection edge of a selective diffusion mask has been proposed. As the channel length is determined by the difference of the diffusion length measured from the same position and not directly affected by photoengraving technique, excellent super-high-frequency characteristics can be obtained, because said channel length can be made to be shorter by one order of magnitude than the minimum value (several $\mu$) of a transistor of conventional structure. However, this improved transistor requires indispensably the use of the so-called epitaxial growth technique and isolation diffusion process in order to be made in an integrated circuit.

Furthermore, excellent integrated circuits having high performance have not yet been obtained because it has been impossible to combine skillfully a transistor having excellent high-frequency characteristics and a depletion-type transistor having characteristics which are substantially equivalent to constant-current characteristics.

SUMMARY OF THE INVENTION

Therefore, an essential object of the invention is to provide a high-frequency field-effect transistor adapted for integrated circuits and requiring no expitaxial or isolation regions which have been necessary in the above-mentioned improved transistors.

A second object of the invention is to provide a high-frequency field-effect transistor which is utilized as a constructional element in an integrated circuit of high performance and low substrate effect.

A third object of the invention is to provide a high-frequency field-effect transistor with a narrow drain area.

A fourth object of the invention is to provide an improved integrated circuit in which a load transistor can be made as a depletion type transistor having load characteristics which are nearly equal to constant-current characteristics.

A fifth object of the invention is to provide an improved integrated circuit having an excellent performance and being composed of a field-effect transistor in which the equivalent length of the base region is determined by the difference between diffusion distances of two kinds of impurities and a depletion-type field-effect transistor.

The foregoing and other objects of the invention are attained by adopting a transistor structure in which the substrate is made of a semiconductor, the impurity of which is same as that of the base region, and the impurity concentration of said base region is reduced from the source region toward the drain region and the said impurity concentration is selected so as to be less at its junction with the drain region than at its junction with the source region.

The characteristic features, structures and functions of the inventions will become more apparent by the following description taken in conjunction with the accompanying drawings, in which the same or equivalent members are designated by the same numerals and characters.

BRIEF DESCRIPTION OF THE DRAWINGS:

FIGS. 1($a$) and ($b$) are schematic, sectional views of a part of a field-effect transistor the channel length of which is determined by a conventional diffusion method;

FIG. 2 is a schematic, sectional view of a field-effect transistor having a structure according to the invention;

FIG. 3($h$) is an equivalent circuit diagram of the integrated circuit shown in FIG. 3($g$);

Figure 3E:
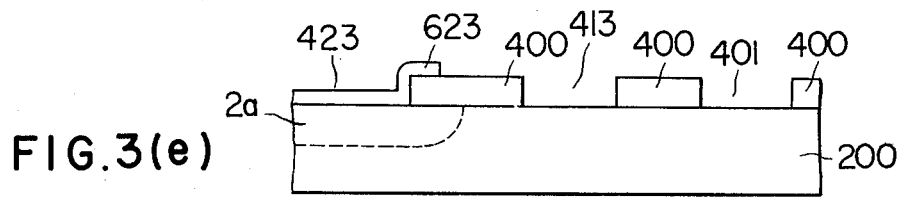
FIGS. 3($a$), ($b$), ($c$), ($d$), ($e$), ($f$) and ($g$) are enlarged sectional views showing, respectively, successive process steps for fabricating an improved integrated circuit according to the invention.

DETAILED DESCRIPTION OF THE INVENTION:

In FIG. 1($a$) there is shown an example of a conventional high-frequency field-effect transistor having a drain region 1, a base region 2 having the opposite type of conductivity relative to that of the drain region and forming a channel at its position on the semiconductor surface, a source region 3, a gate insulating layer 4, and a gate electrode 5. For adapting the field-effect transistor mentioned above to an integrated circuit as shown in FIG. 1($b$), it is necessary to form a crystal region 100 forming a part of the drain region or having the same conductivity as that of the drain region on a substrate 200 of an opposite conductivity type relative to that of the drain region, to provide an isolated region 1$a$ in said crystal region 100 by spaced isolation diffusion regions 2S, and to prepare such a structure as shown in FIG. 1($a$) in said region 1$a$, thus necessitating use of the epitaxial technique and isolation diffusion process.

On the contrary, in accordance with this invention, a semiconductor of the same conductivity type as that of the base region is used as the substrate, thereby avoiding the necessity of using the epitaxial technique. A field-effect transistor constructed according to the invention is shown in FIG. 2 as comprising a drain region 1, a diffused base region 2$a$, a base region 2$b$, a source region 3, a gate insulating layer 4 and a gate electrode 5. In this transistor, the effective channel length is determined by the length L$c$ of the diffused base region 2$a$ at the surface of the semiconductor. That is, in the case when the drain voltage is low, the impurity concentration of the diffused base region 2$a$ is higher than that of the substrate 200, so that when the gate voltage is increased toward operational value, carriers are first produced on the surface of the base region 2$b$ formed from a part of the substrate, and then carriers are produced on the surface of the diffused base region 2$a$, whereby the real G$m$ is determined by the length L$c$ of the surface of the diffused base region 2$a$ and this G$m$ increases because the resistance of the channel formed in the base region 2b is low.

Furthermore, when the substrate is made of a high resistance semiconductor, and the drain voltage is high, all portions of the region 2b between the base region 2a and the drain region 1 become a depletion layer, and the channel length becomes equal to Lc. In this case, the gate electrode 5 may be provided in a manner such that it is not superposed on the drain region 1 thereby remarkably reducing feedback capacitance. Furthermore, the drain region 1 and the source region 3 may be produced by the same diffusion process and the plane area of the drain region 1 can be reduced, thus achieving extreme reduction of the drain capacitance. A method of making a transistor of the kind illustrated in FIG. 2 and an example in which such transistor is applied to an integrated circuit will be described here below with reference to FIGS. 3(a) to (g) in which the left hand portion corresponds to the transistor of FIG. 2.

Firstly, as shown in FIG. 3(a), an insulating region 400 for a diffusion mask is bonded to a semiconductor substrate 200 by an oxidation or vapor-phase reaction. The substrate is, for example, a p-region (small concentration of p-type impurities).

Secondly, as shown in FIG. 3(b), diffusion windows 423, 413 and 401 which are necessary for diffusing the source, base, and drain regions 3, 2a and 1 are formed by photoengraving.

Thirdly, an insulating layer 600 containing a p-type impurity composing the base region 2a is uniformly formed on the device, as shown in FIG. 3(c).

Fourthly, as shown in FIG. 3(d), a portion of the insulating layer 600 overlying windows 413 and 401 is removed by photoengraving while another part 623 which overlies and is larger than the diffusion window 423 is caused to remain. A diffusion process is then carried out in a high-temperature atmosphere from said part 623 through the diffusion window 423, whereby the p-type impurity of layer 600 is diffused into a portion of the substrate to form a base region 2a as shown in FIG. 3(e).

Figure 3F:
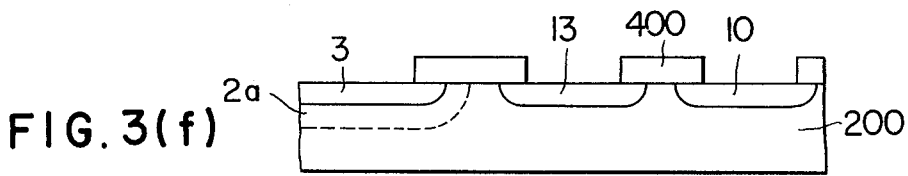

Fifthly, as shown in FIG. 3(f), with insulating layer 623 remaining when it is very thin or after removing said layer when it is thick, a diffusion of n-type impurities is carried out to produce simultaneously a source region 3 of the transistor used as an active element, a drain region 13 of said transistor and serving also as the source region of a load transistor, and a drain region 10 of the load transistor. The diffusion operation is carried out in such a manner that the region 2a having an impurity of the same conductivity type as that of the substrate but of higher concentration and a region 2b of the same impurity type and concentration as the substrate are caused to remain between the source region 3 and the drain region 13. The diffusion operation in the step of FIG. 3(f) can be carried out with any suitable gas, liquid or solid source of the impurities.

Figure 3G:
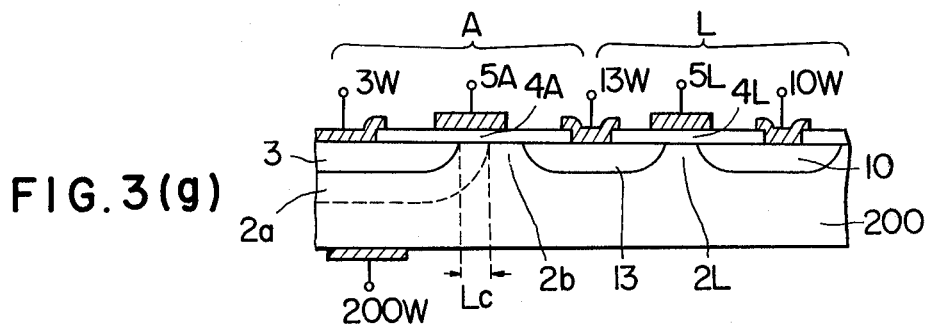

Sixthly, as shown in FIG. 3(g), gate insulating layers 4A and 4L, gate electrode 5A and 5L, and electrodes 3W, 13W, 10W, and 200W are deposited on the device, whereby fabrication of the essential parts of an integrated circuit is completed.

A specific example of the process illustrated in FIGS. 3(a) to (g) is as follows. A Si wafer of p type conductivity, preferably having a resistivity of greater than 100 ohms - centimeter is used as the starting material. Grease is removed from the wafer by the ultrasonic washing in the organic solvent, acetone, benzene etc.

The oxide film 400 is formed on the wafer 200 as illustrated in FIG. 3(a) by oxidation in the steam at 1100° C. The diffusion holes 401, 413 and 423 shown in FIG. 3(b) for the source and drain formation are opened by using photoengraving technique in usual manner. The BDO (Boron doped oxide) layer 600 is applied to the whole surface as illustrated in FIG. 3(c). The BDO is etched away from the surface by phtoengraving technique except in the hole 423 as shown in FIG. 3(d). The BDO in the hole 401 and 413 must be entirely removed from the surface. By performing a heat treatment in $N_2$ gas at 1200° C to diffuse the boron in the BDO 623 into the substrate, the p type base region 2a is formed as illustrated in FIG. 3(e). The BDO 623 is removed by using buffered HF, and the hole 423 is again opened. Using usual diffusion process, phosphorus is diffused through the holes 401, 413 and 423 into the substrate 200 as illustrated in FIG. 3(f) to form therein the drain region 10 of the load transistor, the region 13 which serves as the source region of the load transistor and the drain region of the amplifying transistor and the source region 3 of the amplifying transistor respectively. The mask 400 is removed from the surface and then by the oxidation in the steam at 900° C the thin oxide film 4A, 4L is formed. Thereafter a phosphorus treatment is carried out to stabilize the oxide film. The insulating layer thus formed is of the same material throughout and, as seen in FIG. 3(g), is of uniform thickness.

Next holes are opened above the regions 10, 13 and 3 for electrical contacts to respective regions. Then metal A$l$ is evaporated and deposited on the surface. Using photoengraving technique, the unnecessary portion of the A$l$ is removed to form the gates 5A and 5L for the amplifying and the load transistors respectively and the electrical contacts 3W, 13W and 10W for the respective regions mentioned above.

It will be understood that the opposite type of impurities can be used in the respective steps of the process described above. Thus the p-type impurities in the steps of FIGS. 3(a) and 3(e) may be replaced by n-type impurities and the n-type impurities of the step of FIG. 3(f) may be replaced by p-type.

Figure 3H:
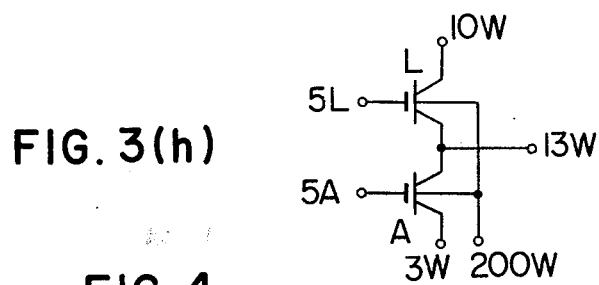

The integrated circuit shown in FIG. 3(g) can be represented by an equivalent circuit as shown in FIG. 3(h), in which if the terminals 5A, 13W, 10W, 3W and 200W corresponding respectively to the electrodes 5A, 13W, 10W, 3W and 200W of the device shown in FIG. 3(g) are used, respectively, as an input terminal, an output terminal, a power terminal, a ground terminal, and a control terminal for controlling the threshold voltage of each MOS type transistor, the device can operate as an amplifier or as a switching circuit.

The terminal 5L may be used in the state wherein it is connected with the power voltage. Furthermore, if a substrate 200 made of p-type silicon and gate insulating layers 4A and 4L made of $SiO_2$ are used, the load transistor L becomes one of depletion type, so that a high performance type integrated circuit having a constant current bias can be obtained by connecting the terminal 5L with the terminal 13W by means of internal wiring of the integrated circuit.

In the example described above, even when an insulating layer capable of being dissolved by an etchant different from that of the mask 400 or being dissolved in a time less than half the time required to dissolve the mask 400, is used in place of the insulating layer 600 to mask the impurity which is diffused to form the region 2a and only the region 623 is removed by photoengraving, the same structure as that of FIG. 3(g) can be obtained.

As will be understood from the above description, according to this method, an isolation diffusion process is not essentially required. As the impurity concentration of the substrate is relatively low, it is possible to obtain a high-frequency integrated circuit in which the output capacitance (drain capacitance of the transistor to be used as an active element) is small, and the frequency characteristics of the active element are made larger by one order of magnitude than the conventional high-frequency integrated circuits.

Furthermore, in the integrated circuit illustrated in FIG. 3(g), if the impurity concentration of the substrate 200 is designed so that, in the region of the transistor A, the base region 2b having a low impurity concentration and positioned between the source region 3 and drain region 13 becomes a depletion layer, the effective channel length of the transistor A becomes equal to the length Lc of the base region formed by diffusion through the same edge of the diffusion window as that of the source region 3. With the method illustrated by FIGS. 3(a) to (f) the distance Lc is determined by the difference of the diffusion length, from the edge of the insulator 400, in the diffusion of p-type impurity in the step illustrated in FIG. 3(e) and the n-type impurity in the step illustrated in FIG. 3(f). The distance Lc is thus controlled by the diffusion constant of the impurities, the time of diffusion and the temperature of diffusion. Consequently, in view of the possibility of easily controlling the diffusion length to less than $1\mu$ with an accuracy of less than 100 A, it is possible to provide a super-high-frequency transistor having a short channel length as an active element.

On the other hand, in the load transistor L, differing from the case of the transistor A, the impurity concentration of the region 2L between the source region 13 and the drain region 10 is low, and variation of threshold voltage of the load transistor L due to variation of the output voltage is relatively small, so that formation of a load transistor capable of being designed so as to have a high output voltage and a large gain becomes possible.

As described above, according to the invention, an integrated circuit having excellent high frequency characteristics and high performance can be easily and economically manufactured. Furthermore, since the impurity concentration of the substrate can be easily reduced, the load transistor can be made so as to be a depletion type independent of the transistor being used as the active element, whereby it becomes possible to construct a load transistor having characteristics which are substantially equivalent to constant-current characteristics, thus affording realization of an integrated circuit having excellent high-frequency characteristics and low-power characteristics.

As described above in detail, the channel length of a field-effect transistor, in which the effective channel length is determined by the difference between the diffusion lengths of two kinds of impurities, can be made to be less than $1\mu$, thus affording the possibility of using said transistor as a super-high-frequency transistor. On the other hand, a so-called depletion type field-effect transistor has load characteristics which are substantially equal to constantcurrent characteristics, so that said transistor can be effectively used for a low-power, high-speed integrated circuit.

Referring to FIG. 3(g), an excellent integrated circuit having high performance can be fabricated by combining the above described field-effect transistors of two kinds.

For the purpose of using a depletion type field-effect transistor as a load, a region capable of suppressing currents is required in order to prevent leakage of the current passing through the transistor into a transistor other than the predetermined transistor. This requirement can be met by surrounding the depletion type field-effect transistor to be used as a load transistor with an amplifier transistor of enhancement type or with only the same diffused region as the base diffused region adapted to determine the channel length. Furthermore, the aforementioned object can be attained by a method of providing separately a diffused region of the same impurity type as that of the base diffused region and by surrounding the load transistor with the diffusion region. That is, it is only necessary to surround the load transistor with a diffused base region or a diffused region which is contiguous to said base region and is of the same impurity type as that of said base region.

An actual integrated circuit comprising a combination of the two kinds of field-effect transistors described above will be described in detail in connected with FIGS. 4 and 5.

Figure 4:
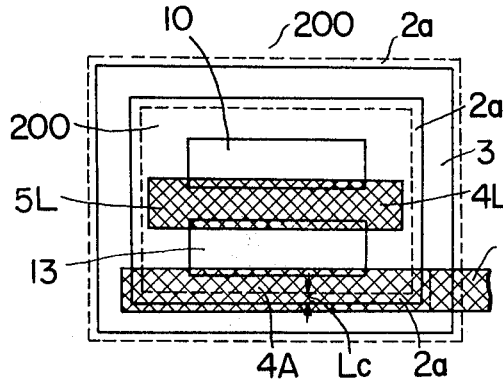
FIG. 4 is a schematic planar view of another example of an integrated circuit fabricated according to the invention.

FIG. 4 illustrates an embodiment in which a load transistor is planarly surrounded by a part of diffused main base region of an amplifier transistor. Referring to FIG. 4, there is shown an integrated circuit comprising a source region 3 of an amplifier transistor, a region 13 serving both as a drain region of said amplifier transistor and a source region of a load transistor, a drain region 10 of said load transistor, a gate electrode 5A of said amplifier transistor and a gate electrode 5L of said load transistor, and insulating layers 4A and 4L beneath said gate electrodes 5A and 5L respectively.

If the source region 3 is diffused by utilizing a positioning mask which is substantially the same in its main part as that used for diffusion of the base region 2a, the shorter distance Lc of the base region 2a can be controlled with an accuracy of less than $1\mu$. When the resistivity of the substrate 200 is high, and te drain voltage is not close to 0 volt, the region between the region 13 and the diffused base region 2a becomes a depletion layer, whereby the channel length of the amplifier transistor becomes substantially equal to Lc, thus imparting excellent high-frequency characteristics to the amplifier transistor.

The gate electrode 5A of the amplifier transistor may be deposited on the entire base region 2a but it is possible to adopt a method whereby a partial region having no gate electrode deposited thereon is provided as shown in FIG. 4, and the insulating layer above said partial region is made thick, lead electrodes from the regions 13 and 10 being therethrough.

In general, according to the structure described above, all parts of the current passing through the load transistor flow into the transistor surrounding said load transistor, and the current liable to flow out through the inversion region of the substrate 200 is stopped by the diffused base region 2a of the amplifier transistor. Of course, it is not always necessary to surround the load transistor completely with the source region 3 of the amplifier transistor, and the surrounding portion may be partially dispensed. Furthermore, it is not always necessary that the surrounding transistor operate as an amplifier. That is, for the purpose of dispensing with a particular processing step necessary for separation, it is only necessary to diffuse a base diffused region onto the periphery of the load transistor at the same time as the base diffusion of the other transistors.

Figure 5:
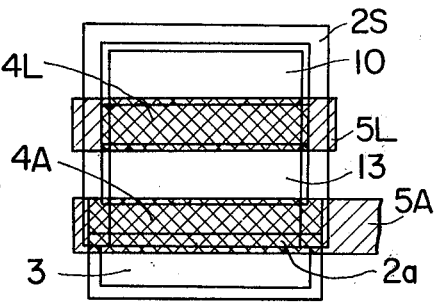
FIG. 5 shows a schematic planar view of another example of an integrated circuit fabricated according to the invention.

FIG. 5 illustrates another example of an improved integrated circuit, in which a load transistor L is surrounded by a diffused region 2S of the same conductivity type as that of base region, said region 2S being made contiguous with the diffused base region 2a of an amplifier transistor.

Detailed description of the example in FIG. 5 is herein omitted, because the essential parts thereof are substantially the same as those designated by the same numerals and characters in the example shown in FIG. 4.

If the diffusion sequence is set in such a manner that n+ diffusion is first carried out by the use of an impurity diffusion velocity thereof which is slow, and then the base diffusion is carried out, the diffusion region 2S can be formed by the same diffusion processing step as that of the base region.

What we claim and desire to secure by Letters Patent is:

1. An integrated circuit comprising a high resistivity semiconductor body having
   a. a surface portion and containing a low concentration of impurities of one conductivity type and a resistivity of at least 100 ohm-cm,
   b. a first region of said one conductivity type located in said surface portion of the semiconductor body having diffused therein impurities of said one conductivity type to provide an impurity concentration in said first region higher than that in said semiconductor body,
   c. a second region located in a part of surface portion of said first region with said first region underlying and around said second region, said second region having diffused therein impurities of the opposite conductivity type to provide an impurity concentration in said second region higher than that in said first region,
   d. a third region located in said surface portion of said semiconductor body spaced from said first and second regions and having diffused therein impurities of the same type of conductivity and same concentration as said second region, said third region being separated from said second region by a surface portion of said semiconductor body of said low impurity concentration and by a surface portion of said first region of higher impurity concentration,
   e. a fourth region located in said surface portion of said semiconductor body spaced from said third region and having diffused therein impurities of the same type of conductivity and same concentration as said third region, said fourth region being separated from said third region by a surface portion of said semiconductor body containing a low concentration of impurities of said one conductivity type,
   f. an insulating layer of one and the same material extending over said surface portion of said semiconductor body including said first region, second region, third region and fourth region and intervening portions of said surface portions, with windows over said second, third and fourth regions, and
   g. metal deposited on said body to form ohmic contacts through said windows with said second, third and fourth regions and gate electrodes overlying said insulating layer over said portion of said first region disposed between said second and third regions and over said surface portion of said semiconductor body disposed between said third and fourth regions,
   h. said second and third regions comprising the source and drain of an amplifying transistor of an enhancement type and said third and fourth regions comprising the source and drain of a load transistor of a depletion type connected in series with said amplifying transistor.

2. An integrated circuit according to claim 1, further comprising a fifth region which is continuous with said first region and surrounds said third and fourth regions, said fifth region containing impurities of the same conductivity type as said first region and having an impurity concentration at least as great as said first region.

3. An integrated circuit according to claim 1, in which said insulating layer is of uniform thickness.

4. An integrated circuit according to claim 1, in which the channel length of said amplifying transistor is determined by the width of the surface portion of said first region around said second region and does not exceed $1\mu$.

5. An integrated circuit according to claim 1, in which the impurity concentration of said surface portion between said second region and said third region decreases in a direction from said second region to said third region and is thereby lower at the junction with said third region than at the junction with said second region.

6. An integrated circuit according to claim 1, in which said substrate is silicon with a low concentration of p-type impurities.

7. An integrated circuit according to claim 6, in which said first region has boron diffused therein.

8. An integrated circuit according to claim 7, in which said second, third and fourth regions have phosphorus diffused therein.

9. An integrated circuit according to claim 6, in which said insulating layer is $SiO_2$.

10. An integrated circuit according to claim 1, in which said ohmic contact with said third region is electrically connected within said circuit with the gate electrode over said surface portion of said semiconductor body disposed between said third and fourth regions.

11. An integrated circuit comprising a depletion type load transistor connected in series with an enhancement type amplifying transistor, said circuit comprising:
    a. a silicon substrate having a surface portion containing a low concentration of p-type impurities and a resistivity of at least 100 ohm-cm,
    b. a first region forming the base of said amplifying transistor and comprising a surface portion of said substrate having diffused therein p-type impurities with an impurity concentration higher than that in said substrate,
    c. a second region forming the source of said amplifying transistor and located in a part of the surface portion of said first region with said first region underlying and surrounding said second region, said second region having diffused therein n-type impurities with an impurity concentration higher than that in said first region,
    d. a third region forming the drain of said amplifying transistor and the source of said load transistor and located in said surface portion of said substrate spaced from said first and second regions so as to be separated from said second region by a surface portion of said substrate of low impurity concentration and by a surface portion of said first region of higher impurity concentration, said third region having diffused therein n-type impurities with the same impurity concentration as said second region, e. a fourth region forming the drain of said load transistor and located in said surface portion of said substrate spaced from said third region by an intervening surface portion of said substrate containing a low concentration of p-type impurities, said fourth region having diffused therein n-type impurities with the same impurity concentration as said third region, f. an insulating layer of $SiO_2$ extending over said surface portion of said substrate, said insulating layer being of uniform thickness except for windows over said second, third and fourth regions, and g. metal deposited over said insulating layer to form ohmic contacts through said windows with said second, third and fourth regions and gate electrodes overlying said insulating layer over said portion of said first region disposed between said second and third regions and over said surface portion of sais substrate disposed between said third and fourth regions.

12. An integrated circuit according to claim 11, in which said third and fourth regions are surrounded by said first and second regions.

* * * * *